United States Patent
Mitani et al.

(10) Patent No.: US 9,178,530 B2
(45) Date of Patent: Nov. 3, 2015

(54) DELTA SIGMA MODULATOR, AS WELL AS RECEIVER DEVICE AND WIRELESS COMMUNICATION DEVICE PROVIDED WITH SAME

(71) Applicant: PANASONIC CORPORATION, Osaka (JP)

(72) Inventors: Yosuke Mitani, Kyoto (JP); Kazuo Matsukawa, Osaka (JP); Koji Obata, Aichi (JP); Shiro Dosho, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 1 day.

(21) Appl. No.: 14/139,146

(22) Filed: Dec. 23, 2013

(65) Prior Publication Data

US 2014/0113575 A1  Apr. 24, 2014

Related U.S. Application Data

(63) Continuation of application No. PCT/JP2011/006662, filed on Nov. 29, 2011.

(30) Foreign Application Priority Data

Jul. 1, 2011  (JP) .................... 2011-147542

(51) Int. Cl.
*H04B 1/48* (2006.01)
*H03M 3/00* (2006.01)
*H04B 1/44* (2006.01)

(52) U.S. Cl.
CPC ............... *H03M 3/422* (2013.01); *H03M 3/44* (2013.01); *H04B 1/44* (2013.01); *H03M 3/454* (2013.01)

(58) Field of Classification Search
CPC ..................................................... H03M 3/454
USPC ................. 455/24, 74, 78, 126, 269
See application file for complete search history.

(56) References Cited

U.S. PATENT DOCUMENTS

| | | | |
|---|---|---|---|
| 6,552,606 B1 * | 4/2003 | Veltman et al. | 330/10 |
| 7,522,079 B1 * | 4/2009 | Wu | 341/143 |
| 2006/0103560 A1 | 5/2006 | Nagai | |
| 2011/0050476 A1 | 3/2011 | Dosho et al. | |

FOREIGN PATENT DOCUMENTS

JP        4567420 B2    10/2010

OTHER PUBLICATIONS

Matsukawa, Kazuo, et al.: "A Fifth-Order Continuous-Time Delta-Sigma Modulator With Single-Opamp Resonator", IEEE Journal of Solid-State Circuits, vol. 45, No. 4, pp. 697-706, Apr. 2010.
Dörrer, Lukas, et al.: "A 10-Bit, 4 mW Continuous-Time Sigma-Delta ADS for UMTS in a 0.12 μm CMOS Process", IEEE, pp. I1057-I1060, 2003.
International Search Report issued in PCT/JP2011/006662, dated Dec. 27, 2011, with English translation, 3 pages.

* cited by examiner

*Primary Examiner* — Tuan H Nguyen
(74) *Attorney, Agent, or Firm* — McDermott Will & Emery LLP

(57) ABSTRACT

A delta sigma modulator includes a filter circuit including an integrator having an operational amplifier; a first addition circuit provided between an output section of the filter circuit and an input section of a quantizer, and including a first resistive element; and a second addition circuit including at least one of a first feedforward circuit including a second resistive element or a first feedback circuit configured to feed back, as an analog signal, a digital output signal having been quantized by the quantizer, to an input section of the quantizer, wherein at least one of the first addition circuit or the first feedback circuit includes a phase compensator.

16 Claims, 15 Drawing Sheets

DELTA SIGMA MODULATOR, AS WELL AS RECEIVER DEVICE AND WIRELESS COMMUNICATION DEVICE PROVIDED WITH SAME

CROSS-REFERENCE TO RELATED APPLICATIONS

This is a continuation of International Application No. PCT/JP2011/006662 filed on Nov. 29, 2011, which claims priority to Japanese Patent Application No. 2011-147542 filed on Jul. 1, 2011. The entire disclosures of these applications are incorporated by reference herein.

BACKGROUND

The present disclosure relates to delta sigma modulators, as well as receiver devices and wireless communication devices provided with the delta sigma modulators, and in particular, to a delta sigma modulator including an integrator having an operational amplifier.

In general, a continuous-time delta sigma modulator includes, as a loop filter (a filter circuit), an Active-RC filter including integrators connected in cascade and each having an operational amplifier, or a gm-C filter including integrators connected in cascade and each having an operational transconductance amplifier (an OTA) and a capacitive element.

Generally, to a node between an output section of a loop filter (a filter circuit) including cascaded integrators having an operational amplifier(s) and an input section of a quantizer, any one of the following signals is added: an analog input signal, a feedforward signal obtained from an output signal of at least one stage of the cascaded integrators, or a feedback signal (an analog signal) obtained by subjecting a digital output signal from the quantizer to digital-to-analog conversion. Signal addition by using an operational amplifier and a resistive element and signal addition by using only a resistive element are known as applicable methods for adding a signal to the input section of the quantizer.

A technique to add, by using an operational amplifier and a resistive element, a signal to an input section of a quantizer of a continuous-time delta sigma modulator which includes integrators connected in cascade and each having an operational amplifier(s) is disclosed. See Lukas Dorrer, et al., "A 10-bit, 4 mW continuous-time sigma-delta ADC for UMTS in a 0.12 μm CMOS process", Circuits and Systems, ISCAS '03, 25-28 May 2003, vol. 1, p. 14057-1-1060, (2003).

Another technique to add a signal to an input section of a quantizer included in a fifth-order continuous-time delta sigma modulator by using only a resistive element is disclosed. See Kazuo Matsukawa, et al., "A fifth-order continuous-time delta-sigma modulator with single-opamp resonator", IEEE JSSC, vol. 45, no. 4, p. 697-706, (April 2010).

Japanese Patent No. 4567420 describes a technique related to a gm-C filter circuit which is capable of performing phase compensation with a reduced power consumption, and a delta-sigma analog-to-digital (A/D) convertor provided with the gm-C filter circuit.

SUMMARY

However, in a configuration in which a signal is added to an input section of a quantizer by using an operational amplifier and a resistive element as described in Dorrer, it is necessary to increase the accuracy of a signal output from the operational amplifier for signal addition in order to increase the accuracy of the delta sigma modulator. That is, the operational amplifier for signal addition is required to output a signal having a minimized error. Consequently, the operational amplifier for signal addition consumes several times as much power as other operational amplifiers consume, and requires an increased circuit area.

On the other hand, a configuration in which a signal is added to an input section of a quantizer by using only a resistive element as described in Matsukawa requires no operational amplifier for signal addition. Accordingly, it is possible to avoid an increase in the power consumption and an increase in the circuit area that are caused by an operational amplifier for signal addition.

FIG. 11 shows a configuration example of a first-order delta sigma modulator whose addition circuit is constituted by resistive elements only.

The delta sigma modulator illustrated in FIG. 11 includes an input terminal N600, a filter circuit 600, a quantizer 601, digital-to-analog converters (DACs) 602, 603, resistive elements 701, 702, and an inverter element 900. A capacitance 820 denotes a parasitic capacitance of an input node N601 of the quantizer 601. The filter circuit 600 includes an integrator having an operational amplifier 604, a resistive element 700, and a capacitive element 801.

An analog input signal having been input from the input terminal N600 is input to the quantizer 601 via the filter circuit 600 and the resistive element 701. The quantizer 601 quantizes the signal, and outputs the signal as a digital output signal. The digital output signal is fed back as an analog signal to the filter circuit 600 by the digital-to-analog converter 602, and to an input section (i.e., the node N601) of the quantizer 601 by the digital-to-analog converter 603. On the other hand, the analog input signal is added to the input section of the quantizer 601 via the inverter element 900 and the resistive element 702.

Here, the delta sigma modulator is a negative feedback loop. Accordingly, when a finite gain bandwidth of the operational amplifier 604 is small, the entire loop filter (the entire filter circuit 600) has an insufficient phase margin and stability of the delta sigma modulator decreases. In addition, in the configuration as shown in FIG. 11 in which a signal is added by using only a resistive element, poles are produced by the resistive element 701 and the parasitic capacitance 802 of the node N601, and the stability of the delta sigma modulator is reduced.

FIG. 12A shows examples of the amplitude-frequency characteristic and the phase-frequency characteristic of the delta sigma modulator shown in FIG. 11. In FIG. 12A, the upper graph shows the amplitude-frequency characteristic, and the lower graph shows the phase-frequency characteristic (FIGS. 12B and 15, which will be described later, also show frequency characteristics in the same manner). In FIG. 12A, p1 denotes a pole frequency of the operational amplifier 604, and pRC denotes a pole frequency of the addition circuit including the resistive element 701 and connected to the input section of the quantizer 601.

In FIG. 12A, the delta sigma modulator shown in FIG. 11 has a phase margin smaller than 45 degrees (as indicated by the arrow A) due to influences of, e.g., the parasitic capacitance 802, the resistive elements 701 and 702, and the finite gain bandwidth of the operational amplifier 604. That is, the delta sigma modulator does not satisfy the stability condition, and the circuit may oscillate.

FIGS. 13A and 13B respectively show a spectrum example and a pole-zero plot example of noise transfer function of the delta sigma modulator shown in FIG. 11. FIG. 13B, in which a pole denoted by p10 is located outside the unit circle on a z-plane, also shows that the delta sigma modulator of FIG. 11 does not satisfy the stability condition.

Increasing the finite gain bandwidth of the operational amplifier 604 is a possible measure against this problem. The finite gain bandwidth can be increased by increasing a current of an output stage of the operational amplifier 604, for example.

FIG. 12B shows examples of the amplitude-frequency characteristic and the phase-frequency characteristic of the delta sigma modulator of FIG. 11 in which the finite gain bandwidth of the operational amplifier 604 has been increased by a factor of 10. In FIG. 12B, the solid lines represent the frequency characteristics of the operational amplifier 604 whose finite gain bandwidth has been increased by a factor of 10, and the dotted lines represent the original frequency characteristics shown in FIG. 12A. Increasing the finite gain bandwidth of the operational amplifier 604 by a factor of 10 causes the pole frequency of the operational amplifier 604 to change from p1 to p1'.

As shown in FIG. 12B, increasing the finite gain bandwidth by a factor of 10 causes a phase shift in a high-frequency region to be reduced, and the phase margin is improved from less than 45 degrees (indicated by the arrow A) to 45 degrees or more (indicated by the arrow B). Consequently, the delta sigma modulator can satisfy the stability condition.

FIGS. 14A and 14B respectively show a spectrum example and a pole-zero plot example of noise transfer function of the delta sigma modulator of FIG. 11 in which the finite gain bandwidth of the operational amplifier 604 has been increased by a factor of 10. FIG. 14B, in which all of the poles are located within the unit circle on the z-plane, shows that the delta sigma modulator satisfies the stability condition.

FIG. 15 shows examples of the amplitude-frequency characteristic and the phase-frequency characteristic of a second-order delta sigma modulator. In FIG. 15, the dotted lines represent the frequency characteristics when no change occurs in a finite gain bandwidth of an operational amplifier, and the solid lines represent the frequency characteristics when the finite gain bandwidth has been increased by a factor of 10. In FIG. 15, increasing the finite gain bandwidth of the operational amplifier by a factor of 10 also causes the pole frequency to change from p1 to p1', in a manner similar to FIG. 12B. As shown in FIG. 15, increasing the finite gain bandwidth by a factor of 10 also improves the phase margin of the second-order delta sigma modulator, from less than 45 degrees (as indicated by the arrow A) to 45 degrees or more (as indicated by the arrow B). The second-order delta sigma modulator can thus satisfy the stability condition.

As described above, with the configuration in which a signal is added to the input section of the quantizer 601 by using only the resistive element, the stability of the delta sigma modulator can be maintained by increasing the finite gain bandwidth of the operational amplifier 604. In this case, however, the power consumption and the circuit area of the operational amplifier 604 disadvantageously need to be increased in a manner similar to the case where a signal is added by using an operational amplifier and a resistive element.

When further accuracy improvement of the delta sigma modulator is desired, accuracy improvement (an increase in the number of bits) of the quantizer 601 and accuracy improvement of the digital-to-analog converter 603 connected to the input section of the quantizer 601 are needed. The accuracy improvement of the quantizer 601 and the digital-to-analog converter 603 is likely to cause a further increase in the parasitic capacitance 802 and a further and considerable decrease in the stability of delta sigma modulator having the configuration shown in FIG. 11, thereby creating the possibility that the decrease in the phase margin cannot be compensated only by increasing the current of the operational amplifier 604 and that the delta sigma modulator cannot satisfy the stability condition. Consequently, it becomes impossible to increase the resolving power of the quantizer 601 and the digital-to-analog converter 603. It thus becomes difficult to improve the accuracy of the delta sigma modulator.

It is therefore an object of the present disclosure to provide a highly stable delta sigma modulator which does not require a finite gain bandwidth of an operational amplifier to be large and which operates with a reduced power consumption and a reduced circuit area (reduced circuit costs).

A delta sigma modulator according to a first aspect of the present disclosure includes: a filter circuit including at least one integrator having an operational amplifier; a quantizer configured to quantize an output signal from the filter circuit; a first digital-to-analog converter configured to convert a digital output signal from the quantizer into an analog signal and feed back the analog signal to the filter circuit; a first addition circuit located between an output section of the filter circuit and an input section of the quantizer and including at least one passive element, where the at least one passive element includes a first resistive element; and a second addition circuit including at least one of a first feedforward circuit connecting an input section of the filter circuit to the input section of the quantizer via a second resistive element, or a first feedback circuit configured to feed back the digital output signal from the quantizer, as an analog signal, to the input section of the quantizer, wherein at least one of the first addition circuit or the first feedback circuit includes a phase compensator.

In the delta sigma modulator of the first aspect, at least one of the first addition circuit or the first feedback circuit includes the phase compensator. With this configuration, the modulator can compensate a decrease in a phase margin caused by influences of, e.g., a parasitic capacitance at the input section of the quantizer, the first and second addition circuits, and a finite gain width of the operational amplifier, and satisfy the stability condition. Here, the delta sigma modulator includes no operational amplifier for signal addition because the first addition circuit is constituted of the at least one passive element. Further, since at least one of the first addition circuit or the first feedback circuit includes the phase compensator, it is unnecessary to increase the finite gain bandwidth of the operational amplifier. It is thus possible to produce a highly stable delta sigma modulator while reducing the power consumption and the circuit area (the circuit costs).

A delta sigma modulator according to a second aspect of the present disclosure includes: a filter circuit including integrators connected in cascade and in a plurality of stages, where the integrators each include an operational amplifier; a quantizer configured to quantize an output signal from the filter circuit; a first digital-to-analog converter configured to convert a digital output signal from the quantizer into an analog signal and feed back the analog signal to the filter circuit; a first addition circuit located between an output section of the filter circuit and an input section of the quantizer and including at least one passive element, where the at least one passive element includes a first resistive element; and a second addition circuit including at least one of a first feedforward circuit connecting an input section of the filter circuit to the input section of the quantizer via a second resistive element, a first feedback circuit configured to feed back the digital output signal from the quantizer, as an analog signal, to the input section of the quantizer, or a second feedforward circuit configured to feed forward an output signal from at least one of the integrators via at least one passive element, wherein at least one of the first addition circuit, the first feedback circuit, or the second feedforward circuit includes a phase compensator.

In the delta sigma modulator of the second aspect, at least one of the first addition circuit, the first feedback circuit, or the second feedforward circuit includes the phase compensator. With this configuration, the modulator can compensate a decrease in a phase margin and satisfy the stability condition, in a manner similar to the first aspect. Further, similarly to the first aspect, since the modulator of the second aspect includes no operational amplifier for signal addition, it is unnecessary to increase the finite gain bandwidth of the operational amplifier(s). It is thus possible to produce a highly stable delta sigma modulator while reducing the power consumption and the circuit area (the circuit costs).

It is preferable that the first addition circuit of the delta sigma modulator of each of the first and second aspects includes a capacitive element serving as the phase compensator and connected in parallel to the first resistive element.

With this configuration, the first addition circuit includes the first resistive element and the capacitive element connected in parallel, i.e., the first addition circuit is constituted of the passive elements and provided with the phase compensator. In this manner, the delta sigma modulator can have the addition circuit without including any operational amplifier for signal addition. At the same time, the delta sigma modulator can compensate a decrease in the phase margin by means of the capacitive element connected in parallel to the first resistive element, and satisfy the stability condition. It is thus possible to produce a highly stable delta sigma modulator while reducing the power consumption and the circuit area (the circuit costs).

A delta sigma modulator according to a third aspect of the present disclosure includes: a filter circuit including at least one integrator having an operational amplifier; a quantizer configured to quantize an output signal from the filter circuit; a first digital-to-analog converter configured to convert a digital output signal from the quantizer into an analog signal and feed back the analog signal to the filter circuit; a first addition circuit located between an output section of the filter circuit and an input section of the quantizer and including at least one passive element, where the at least one passive element includes a first resistive element; a second digital-to-analog converter configured to convert the digital output signal from the quantizer into an analog signal and feed back the analog signal to the input section of the quantizer; and a high-pass filter between an output section of the quantizer and an input section of the second digital-to-analog converter.

According to this aspect, part which is included in the digital output signal having been quantized by the quantizer 101 and which corresponds to a high frequency component of the yet-to-be quantized analog signal is selectively allowed to pass through the high-pass filter, and is subjected to digital-to-analog conversion in the second digital-to-analog converter to be added, as an analog signal, to the input section of the quantizer. Thus, the modulator of this aspect can compensate a decrease in the phase margin and satisfy the stability condition. Since the high-pass filter used in the modulator is a digital filter, the modulator can reduce the power consumption and the circuit area (the circuit costs) as compared to a case where a high-pass filter constituted of an analog circuit is used. It is thus possible to produce a highly stable delta sigma modulator while reducing the power consumption and the circuit area (the circuit costs).

A delta sigma modulator of a fourth aspect of the present disclosure includes: a filter circuit including at least one integrator having an operational amplifier; a quantizer configured to quantize an output signal from the filter circuit; a first digital-to-analog converter configured to convert a digital output signal from the quantizer into an analog signal and feed back the analog signal to the filter circuit; a first resistive element between an output section of the filter circuit and an input section of the quantizer; a first feedforward circuit connecting an input section of the filter circuit to the input section of the quantizer via a second resistive element; and a capacitive element connected in parallel to the first resistive element.

According to this aspect, the delta sigma modulator includes addition circuits respectively including the first resistive element and the second resistive element that are passive elements whereas no operational amplifier for signal addition is included in the modulator. The capacitive element serving as the phase compensator is connected in parallel to the first resistive element. Therefore, it is unnecessary to increase the finite gain bandwidth of the operational amplifier included in the integrator. It is thus possible to produce a highly stable delta sigma modulator while reducing the power consumption and the circuit area (the circuit costs).

A fifth aspect of the present disclosure relates to a receiver device including: an antenna; and a receiving section including the delta sigma modulator according to any one of the first to fourth aspects and configured to process a received signal from the antenna.

A sixth aspect of the present disclosure relates to a wireless communication device including: an antenna; a receiving section including the delta sigma modulator according to any one of the first to fourth aspects, and configured to process a received signal from the antenna; a transmitting section configured to modulate a transmission signal; and a duplexer section located between the receiving section and the antenna and between the transmitting section and the antenna, and configured to perform switching between supply of the received signal from the antenna to the receiving section and supply of the transmission signal from the transmitting section to the antenna.

According to the fifth aspect, it is possible to produce a receiver device capable of receiving high quality sounds and images while reducing the power consumption and the circuit area of the device. According to the sixth aspect, it is possible to produce a wireless communication device capable of transmitting and receiving high quality sounds and images while reducing the power consumption and the circuit area of the device.

According to the present disclosure, a phase delay in a high-frequency region caused by, e.g. influences of the parasitic capacitance at the input section of the quantizer, the first and second addition circuits, the finite gain bandwidth of the operational amplifier can be compensated without adding an operational amplifier for signal addition and without increasing the finite gain bandwidth of the integrator. It is thus possible to produce a highly stable delta sigma modulator while reducing the power consumption and the circuit area (the circuit costs). It is also possible to produce a receiver device and a wireless communication device which include the delta sigma modulator.

DETAILED DESCRIPTION

Figure 1:
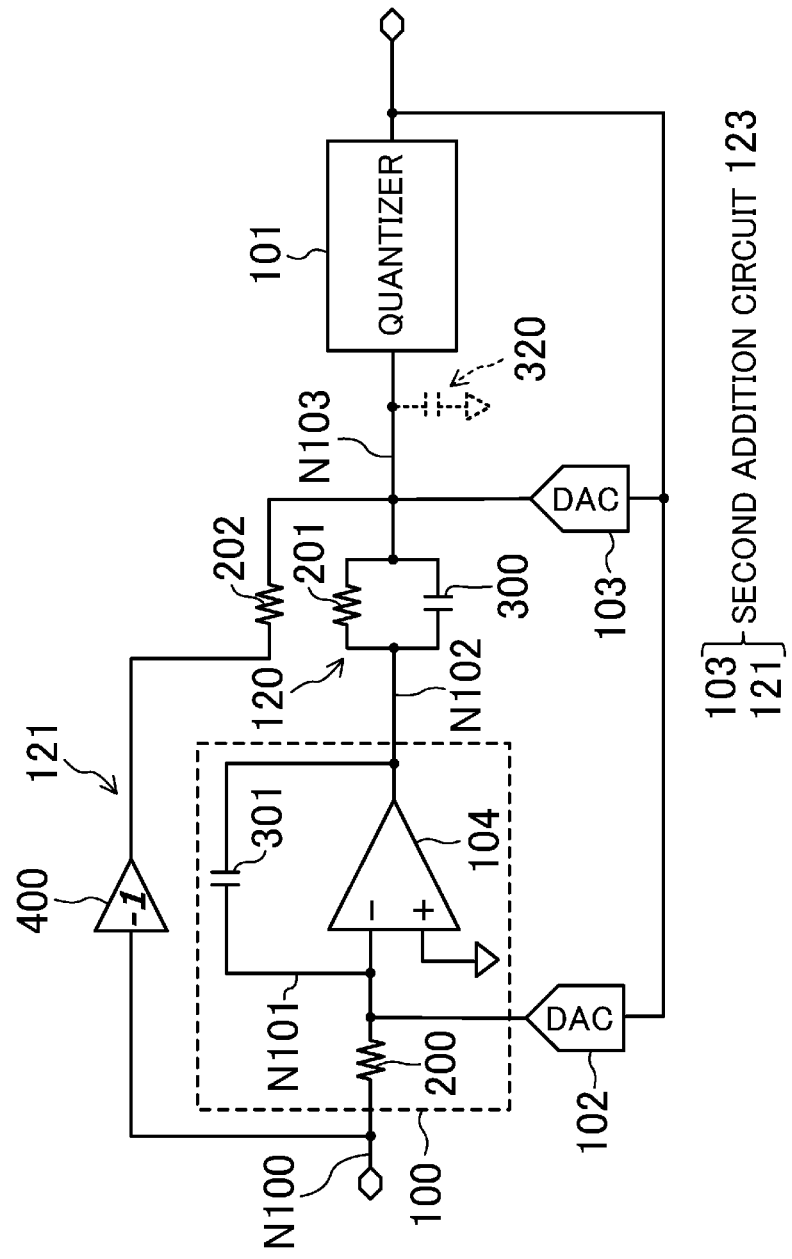
FIG. 1 shows a configuration example of a delta sigma modulator according to first embodiment.

Embodiments of the present disclosure will be described below with reference to the drawings.

In the drawings which will be referred to in the below-described embodiments, the same elements or components are denoted by the same reference characters and the description thereof is not repeated as well as possible.

First Embodiment

FIG. 1 shows a configuration example of a delta sigma modulator according to a first embodiment.

The delta sigma modulator shown in FIG. 1 includes an input terminal N100, a filter circuit 100, a quantizer 101, a first digital-to-analog converter 102, a digital-to-analog converter 103 (i.e., a first feedback circuit), a first resistive element 201 (having a resistance value Rsum1), a second resistive element 202 (having a resistance value Rsum2), a capacitive element 300 (having a capacitance value Csum1), and an inverter element 400. Here, a capacitance 320 represents a parasitic capacitance of an input node 103N of the quantizer 101.

The filter circuit 100 includes an integrator having an operational amplifier 104, a resistive element 200, and a capacitive element 301.

An analog input signal having been input from the input terminal N100 is input to the quantizer 101 via the filter circuit 100 and a first addition circuit 120 including the first resistive element 201 and the capacitive element 300 which are passive elements and connected in parallel. The quantizer 101 quantizes the analog input signal, and outputs the signal as a digital output signal. The first digital-to-analog converter 102 and the digital-to-analog converter 103 convert the digital output signal into an analog signal and feed back the analog signal to the filter circuit 100 and to the input section (i.e. the node N103) of the quantizer 101, respectively. On the other hand, the analog input signal is added to the input section (i.e. the node N103) of the quantizer 101 by a first feedforward circuit 121 including the inverter element 400 and the second resistive element 202. Here, a second addition circuit 123 includes the digital-to-analog converter 103 (i.e. the first feedback circuit) and the first feedforward circuit 121.

Specifically, the input terminal N100 is in connection to an end of the resistive element 200, of which the other end is in connection to a node N101. The node N101 is in connection to an inverting input terminal of the operational amplifier 104 and to an end of the capacitive element 301 whereas the other end of the capacitive element 301 is in connection to a node N102. The node N102 is in connection to an output section of the operational amplifier 104 and to an end of the first resistive element 201 whereas the other end of the first resistive element 201 is in connection to the input node N103 of the quantizer 101. The first resistive element 201 is connected in parallel to the capacitive element 300 which serves as a phase compensator. A non-inverting input terminal of the operational amplifier 104 is grounded.

On the other hand, the input terminal N100 is in connection to an end of the second resistive element 202 via the inverter element 400. The other end of the second resistive element 202 is in connection to the input node N103 of the quantizer 101.

The quantizer 101 quantizes the analog signal having been input from the node N103. The digital output signal from the quantizer 101 is fed back to the first digital-to-analog converter 102 and the digital-to-analog converter 103. The digital output signal having been fed back to the first digital-to-analog converter 102 is subjected to digital-to-analog conversion, and then, passes through the node N101 to be input to the inverting input terminal of the operational amplifier 104. In a similar manner, the digital output signal having been fed back to the digital-to-analog converter 103 is subjected to digital-to-analog conversion, and then, is added as an analog signal to the node N103 to be input to the quantizer 101.

The principles of the phase compensation performed by the capacitive element 300 are now described. The capacitive element 300 is connected in series between the output section of the filter circuit 100 and the input section of the quantizer 101, which causes a zero-point or zero-points to be formed in a transfer function. The zero-point(s) serves to improve a phase margin.

Figure 2:
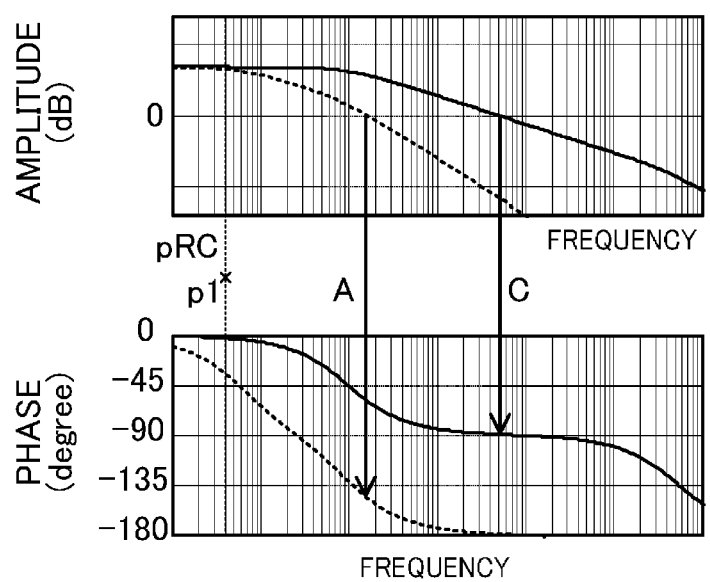
FIG. 2 shows examples of the amplitude-frequency characteristic and the phase-frequency characteristic of the delta sigma modulator according to the first embodiment.
Figure 12A:
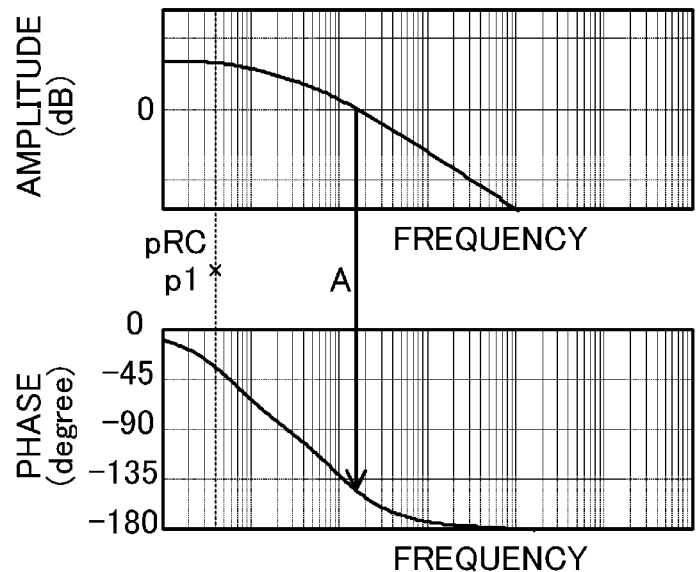
FIGS. 12A and 12B show examples of the amplitude-frequency characteristic and the phase-frequency characteristic of the first-order delta sigma modulator.
Figure 12B:
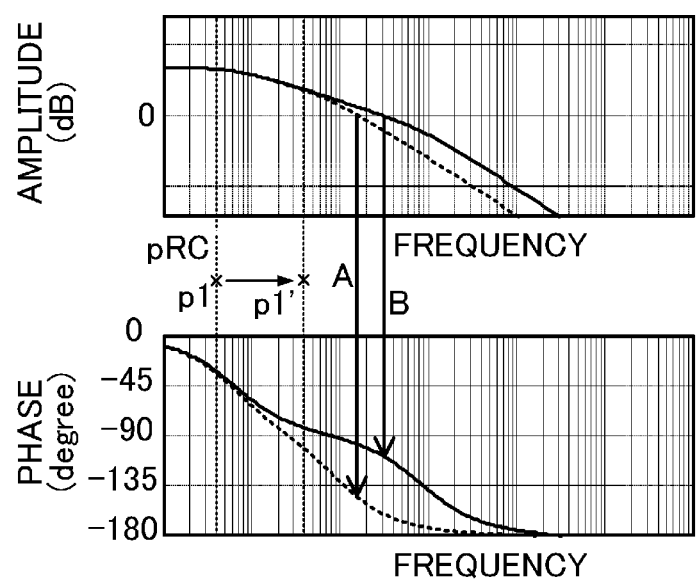
Figure 13A:
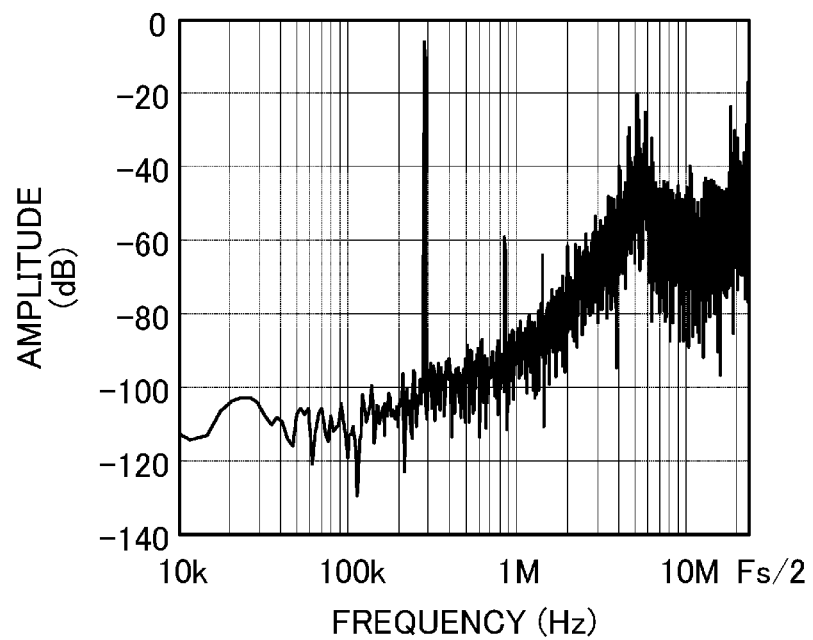
FIG. 13A shows a spectrum example of the first-order delta sigma modulator.
Figure 13B:
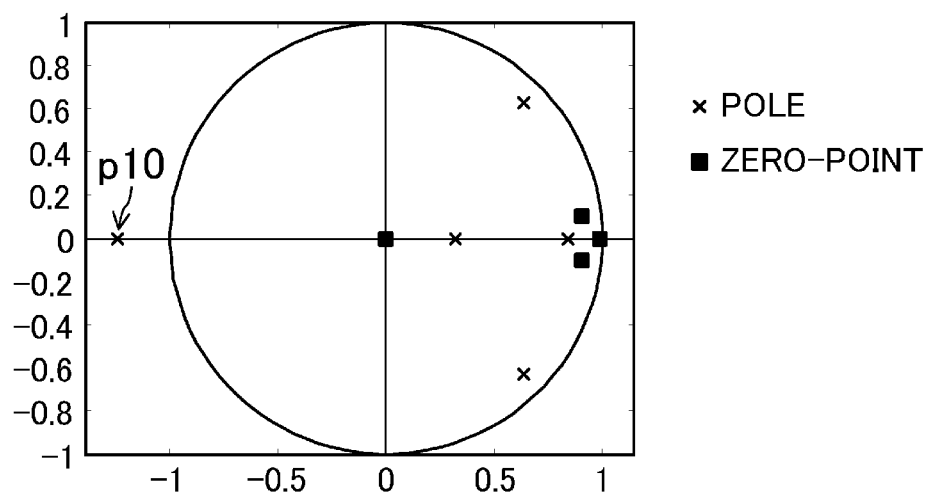
FIG. 13B shows a pole-zero plot example of noise transfer function of the first-order delta sigma modulator.
Figure 14A:
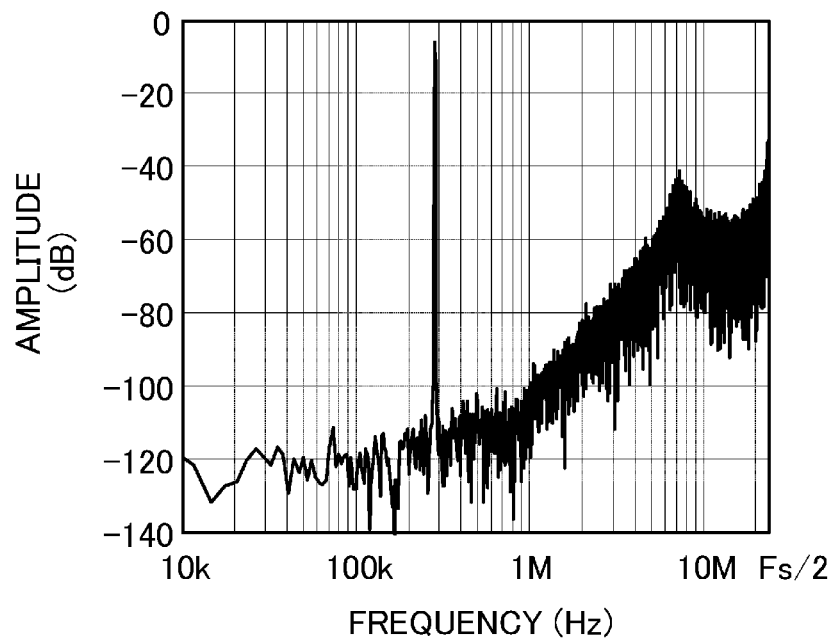
FIG. 14A shows a spectrum example of the first-order delta sigma modulator.
Figure 14B:
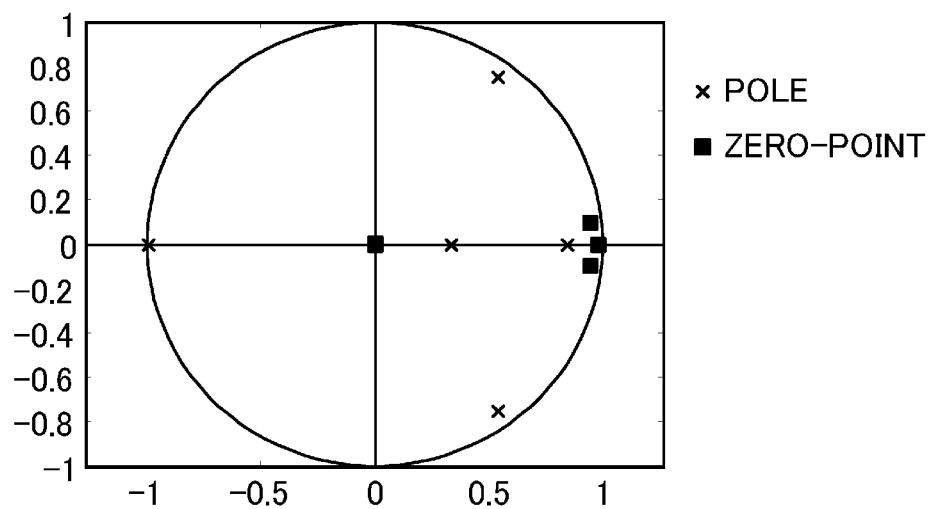
FIG. 14B shows a pole-zero plot example of noise transfer function of the first-order delta sigma modulator.

FIG. 2 shows examples of the amplitude-frequency characteristic and the phase-frequency characteristic of the delta sigma modulator according to this embodiment. In FIG. 2, the upper graph shows the amplitude-frequency characteristic, and the lower graph shows the phase-frequency characteristic (FIG. 5, which will be described later, also shows frequency characteristics in the same manner). The solid lines represent the amplitude-frequency characteristic and the phase-frequency characteristic of the delta sigma modulator of this embodiment, and the dotted lines represent the frequency characteristics of the conventional delta sigma modulator as shown in FIG. 12A. The arrow C and the arrow A respectively indicate the phase margin of the modulator of this embodiment and the phase margin of the conventional modulator when the loop gain is equal to 1, that is, the gain (amplitude) is equal to 0 dB in the frequency characteristics. In FIG. 2, p1 denotes a pole frequency of the operational amplifier 104, and pRC denotes a pole frequency of the first addition circuit 120 including the first resistive element 201 and the capacitive element 300 which are in connection to the input section of the quantizer 101. In this embodiment, since the finite gain bandwidth of the operational amplifier 104 is the same as that of the conventional delta sigma modulator, the pole frequency p1 remains unchanged.

As shown in FIG. 2, the phase margin of the conventional delta sigma modulator is less than 45 degrees (as indicated by the arrow A) whereas the phase margin of the delta sigma modulator of this embodiment is improved to be 45 degrees or more (as indicated by the arrow C). Consequently, the delta sigma modulator of this embodiment can satisfy the stability condition.

In the configuration shown in FIG. 1, it is preferable that the capacitance value Csum1 of the capacitive element 300 satisfies Formula 1 below.

$$Csum\ 1 = \frac{Rsum\ 2 \times Cp}{Rsum\ 1} \quad \text{[Formula 1]}$$

In Formula 1, Cp is a capacitance value of the parasitic capacitance 320. The capacitance value Csum1 of Formula 1 is set such that influence of the parasitic capacitance 320 is cancelled.

Formula 1 is applicable to an example calculation on the assumption that the finite gain bandwidth of the operational amplifier 104 has no influence. When the influence of the finite gain bandwidth of the operational amplifier 104 is not negligible, it is preferable to set the capacitance value Csum1 to a value allowing the modulator to satisfy the stability condition, with taking into consideration influences of, e.g., the filter circuit 100, the first and second addition circuits 120 and 123, and the parasitic capacitance 320 of the node N103.

Figure 3A:
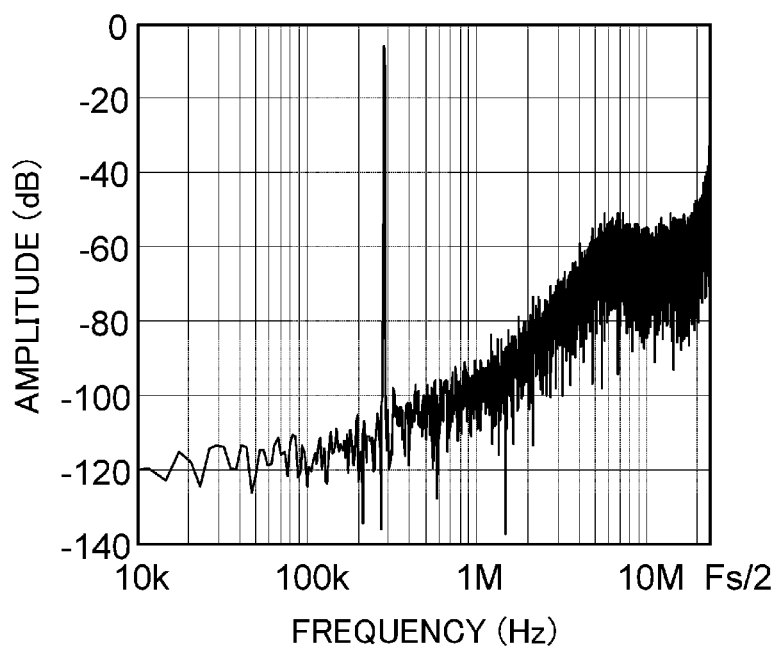
FIG. 3A shows a spectrum example of the delta sigma modulator of the first embodiment.
Figure 3B:
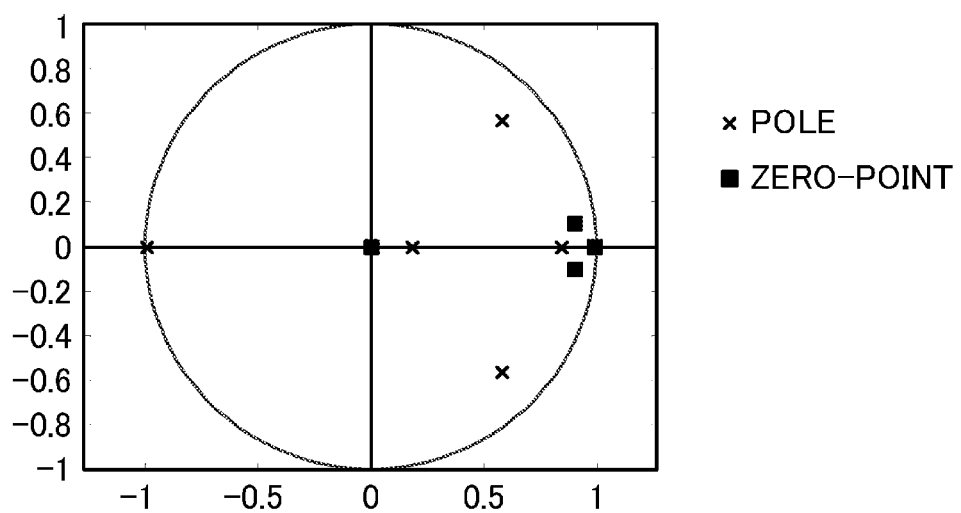
FIG. 3B shows a pole-zero plot example of noise transfer function of the delta sigma modulator of the first embodiment.

FIGS. 3A and 3B respectively show a spectrum example and a pole-zero plot example of noise transfer function of the delta sigma modulator of this embodiment. FIG. 3B, in which all of the poles are located within the unit circle on the z-plane, shows that the delta sigma modulator of this embodiment satisfies the stability condition. That is, the delta sigma modulator of this embodiment can satisfy the stability condition without increasing the finite gain bandwidth of the operational amplifier 104.

As described above, the delta sigma modulator of this embodiment can compensate a decrease in the phase margin caused by the influences of, e.g., the parasitic capacitance 320 of the node N103, the first and second addition circuits 120 and 123, and the finite gain bandwidth of the operational amplifier 104, without increasing the finite gain bandwidth of the operational amplifier 104. That is, the delta sigma modulator can satisfy the stability condition without increasing the finite gain bandwidth of the operational amplifier 104. According to this embodiment, it is thus possible to produce a highly stable delta sigma modulator whose power consumption and chip area are reduced.

Although the delta sigma modulator of this embodiment includes, as the second addition circuit 123, the first feedforward circuit 121 having the second resistive element 202 and the digital-to-analog converter 103 (i.e., the first feedback circuit), the delta sigma modulator may include any one of the first feedforward circuit 121 or the digital-to-analog converter 103.

Second Embodiment

Figure 4:
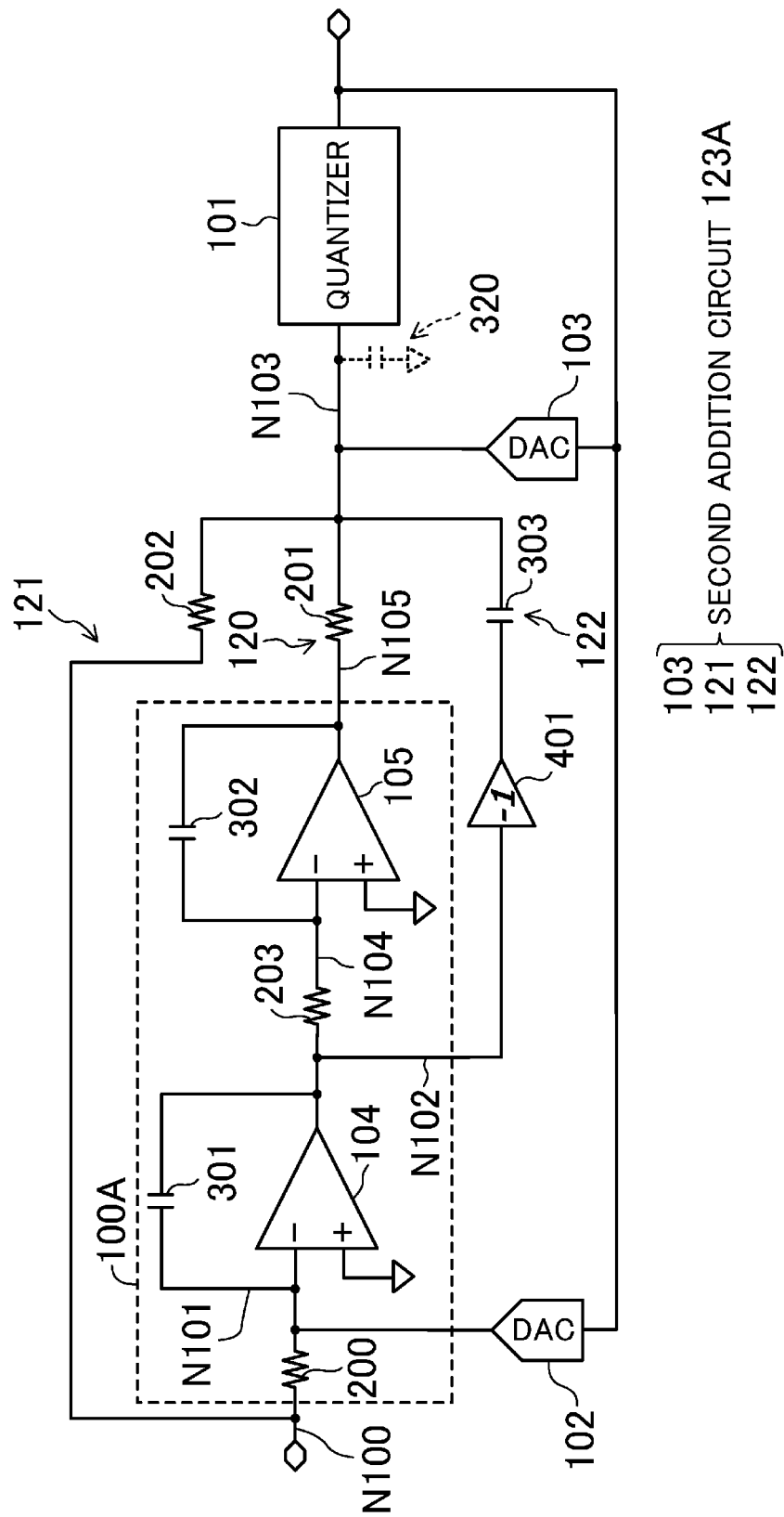
FIG. 4 shows a configuration example of a delta sigma modulator according to a second embodiment.

FIG. 4 shows a configuration example of a delta sigma modulator according to a second embodiment of the present disclosure. Specifically, the delta sigma modulator according to the second embodiment is a second-order delta sigma modulator including two integrators connected in cascade.

The delta sigma modulator shown in FIG. 4 differs from the modulator shown in FIG. 1 in that: a filter circuit 100A of the delta sigma modulator of FIG. 4 includes, in addition to a first stage integrator which is the same as the integrator included in the modulator of FIG. 1, a second stage integrator which includes an operational amplifier 105, a resistive element 203, and a capacitive element 302; and an inverter element 401 and a capacitive element 303 (having a capacitance value Csum2) are added to the delta sigma modulator of FIG. 4 whereas the capacitive element 300 and the inverter element 400 that are included in the modulator of FIG. 1 are omitted.

An analog input signal having been input from an input terminal N100 is input to a quantizer 101 via the filter circuit 100A including the two cascaded integrators, and a first resistive element 201 (i.e. a first addition circuit 120). The quantizer 101 quantizes the analog signal, and then, outputs the signal as a digital output signal. In a manner similar to the modulator of FIG. 1, a first digital-to-analog converter 102 and a digital-to-analog converter 103 convert the digital output signal into an analog signal, and feed back the analog signal. On the other hand, the output signal from the operational amplifier 104 is added to an input section (i.e. a node N103) of the quantizer 101 by a second feedforward circuit 122 including the inverter element 401 and the capacitive element 303. In a manner similar to the modulator of FIG. 1, the analog input signal is added to the input section (i.e. the node N103) of the quantizer 101 by a first feedforward circuit 121 including a second resistive element 202. Here, a second addition circuit 123A includes the digital-to-analog converter 103 (i.e. a first feedback circuit), the first feedforward circuit 121, and the second feedforward circuit 122.

In the modulator shown in FIG. 4, the second stage integrator is connected between a node N102 and an end of the first resistive element 201, and the node N102 is in connection to an output section of the operational amplifier 104 of the first stage integrator. Specifically, the resistive element 203 is connected between the node N102 and a node N104 which is in connection to an inverting input terminal of the operational amplifier 105 included in the second stage integrator. The node N104 is in connection to a node N105 via the capacitive element 302. The node N105 is in connection to an output section of the operational amplifier 105 and an end of the first resistive element 201. Non-inverting input terminals of the operational amplifiers 104 and 105 are grounded.

On the other hand, the node N102 is in connection to an end of the capacitive element 303 via the inverter element 401 whereas the other end of the capacitive element 303 is in connection to the input node N103 of the quantizer 101, thereby forming the second feedforward circuit 122. In other words, the second feedforward circuit 122 includes, as a phase compensator of this embodiment, the capacitive element 303 provided between the input section of the quantizer 101 and the output section of the operational amplifier 104. The inverter element 400 is omitted from the first feedforward circuit 121.

The principles of the phase compensation performed by the capacitive element 303 are now described with reference to FIG. 5.

Figure 5:
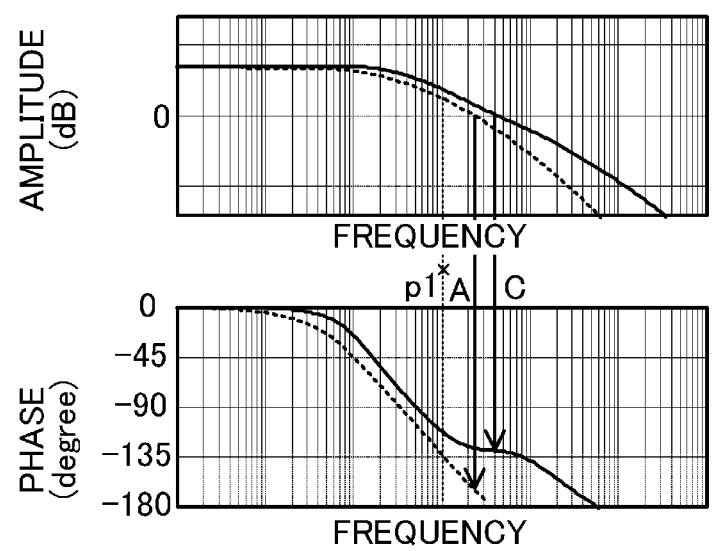
FIG. 5 shows examples of the amplitude-frequency characteristic and the phase-frequency characteristic of the delta sigma modulator according to the second embodiment.
Figure 15:
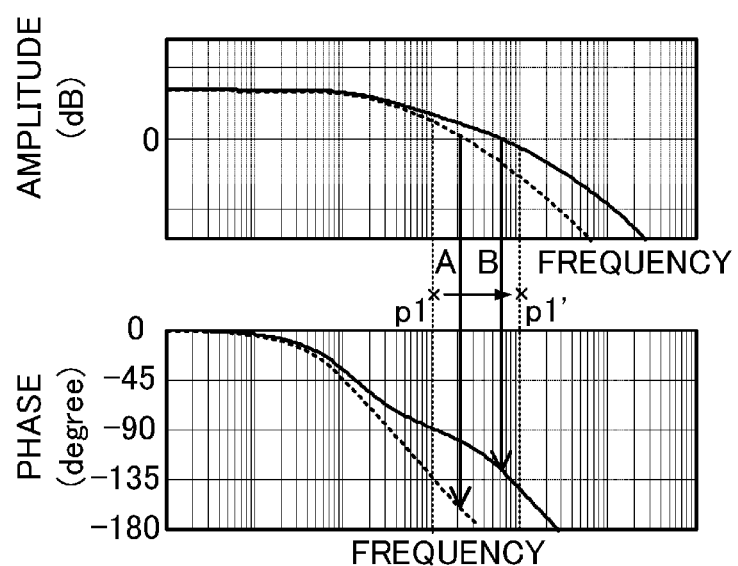
FIG. 15 shows examples of the amplitude-frequency characteristic and the phase-frequency characteristic of a second-order delta sigma modulator.

In FIG. 5, the solid lines represent the amplitude-frequency characteristic and the phase-frequency characteristic of the delta sigma modulator of this embodiment, and the dotted lines represent the amplitude-frequency characteristic and the phase-frequency characteristics of the conventional second-order delta sigma modulator as shown in FIG. 15. In FIG. 5, p1 denotes a pole frequency of the operational amplifiers 104 and 105. In this embodiment, since the finite gain bandwidth of the operational amplifiers 104 and 105 is the same as that of the conventional second-order delta sigma modulator, the pole frequency p1 remains unchanged.

As shown in FIG. 4, the capacitive element 303 is connected in series between the output section of the operational amplifier 104 and the input section of the quantizer 101 via the inverter element 401, which causes a zero-point or zero-points to be formed in a transfer function. The zero-point(s) serves to improve the phase margin. Accordingly, as shown in FIG. 5, a phase shift in a high-frequency region of the delta sigma modulator is reduced by setting the capacitance value Csum2 of the capacitive element 303 to a suitable value which allows the modulator to satisfy the stability condition, with taking into consideration influences of, e.g., the finite gain bandwidth of the operational amplifiers 104 and 105, the first and second addition circuits 120 and 123A, and a parasitic capacitance 320 of the node N103. In this manner, the phase margin of this embodiment is improved to be 45 degrees or more (as indicated by the arrow C) whereas the phase margin of the conventional second-order delta sigma modulator is less than 45 degrees (as indicated by the arrow A). Thus, the delta sigma modulator of this embodiment can satisfy the stability condition.

As described above, the delta sigma modulator of this embodiment can compensate a decrease in the phase margin caused by the influences of, e.g., the parasitic capacitance 320 of the node N103, the first and second addition circuits 120 and 123A, and the finite gain bandwidth of the operational amplifiers 104 and 105, without increasing the finite gain bandwidth of the operational amplifiers 104 and 105. That is, the delta sigma modulator can satisfy the stability condition without increasing the finite gain bandwidth of the operational amplifiers 104 and 105. According to this embodiment, it is thus possible to produce a highly stable delta sigma modulator whose power consumption and chip area are reduced.

In this embodiment, the digital-to-analog converter 103 (i.e. the first feedback circuit) is not always necessary, and the advantages as described above can be obtained without the digital-to-analog converter 103.

It is possible to combine the first embodiment and the second embodiment. A third embodiment which is an example of the combination of the first and second embodiments and variations of the third embodiment will be described next.

Third Embodiment

Figure 6:
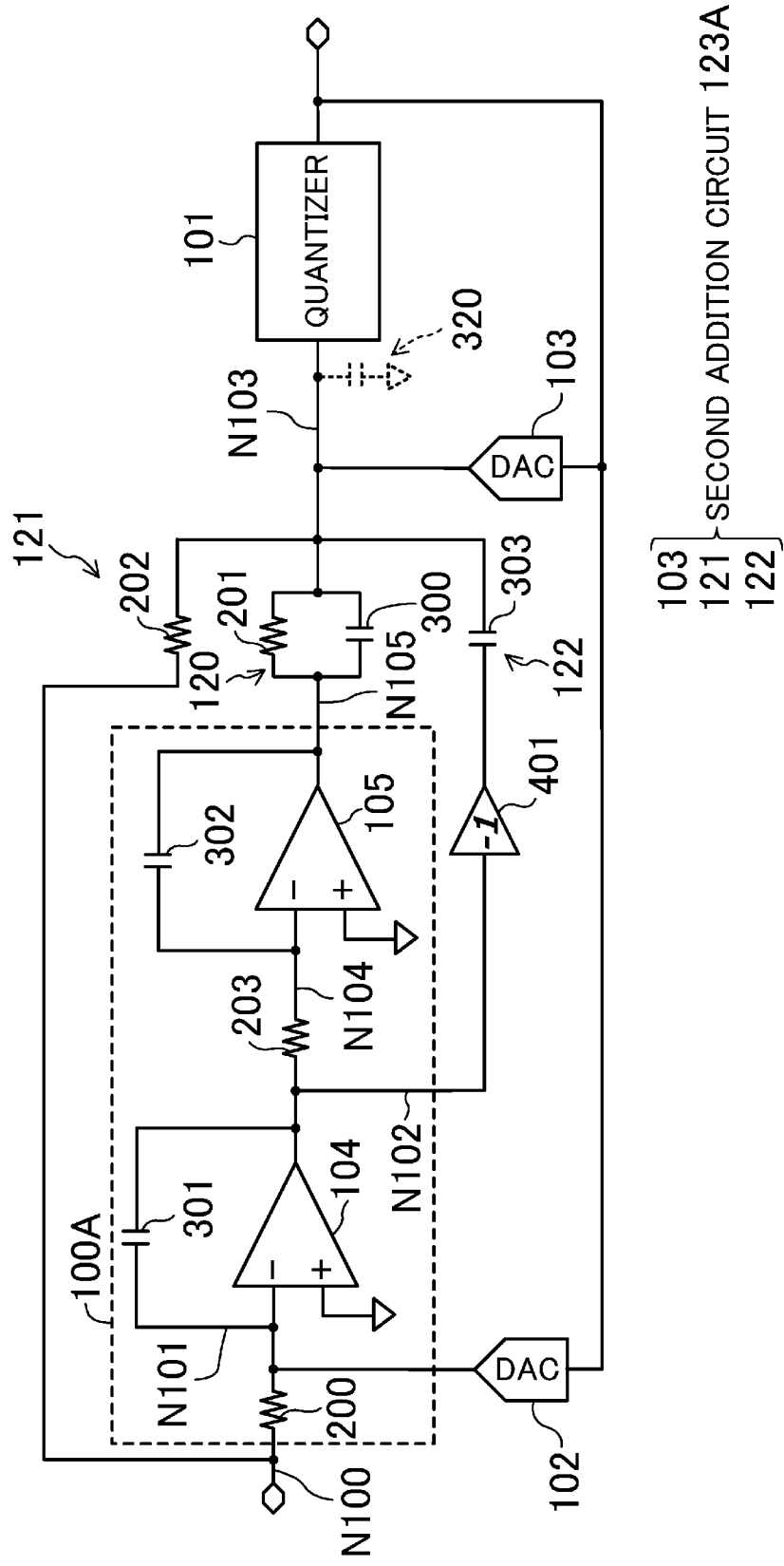
FIG. 6 shows a configuration example of a delta sigma modulator according to a third embodiment.

FIG. 6 shows a configuration example of a delta sigma modulator according to the third embodiment.

The delta sigma modulator shown in FIG. 6 differs from the modulator shown in FIG. 4 in that a capacitive element 300 is connected in parallel to a first resistive element 201 in the modulator shown in FIG. 6.

An analog input signal having been input from an input terminal N100 is input to a quantizer 101 via a filter circuit 100A including two integrators connected in cascade, and a first addition circuit 120 including the first resistive element 201 and the capacitive element 300 that are connected in parallel. In a manner similar to the modulator of FIG. 4, the quantizer 101 quantizes the analog signal and outputs a digital output signal. A first digital-to-analog converter 102 and a digital-to-analog converter 103 convert the digital output signal into an analog signal and feed back the analog signal. On the other hand, a second feedforward circuit 122 adds the output signal from an operational amplifier 104 to an input section (i.e. a node N103) of the quantizer 101, and a first feedforward circuit 121 adds the analog input signal to the input section (i.e. the node N103) of the quantizer 101. In a manner similar to the modulator of FIG. 4, a second addition circuit 123A includes the digital-to-analog converter 103 (i.e. a first feedback circuit), the first feedforward circuit 121, and the second feedforward circuit 122. The delta sigma modulator of this embodiment includes, as phase compensators, a capacitive element 303 and the capacitive element 300. The capacitive element 303 is included in the second feedforward circuit 122 and connected between the input section of the quantizer 101 and an output section of the operational amplifier 104, and the capacitive element 300 is included in the first addition circuit 120 and connected in parallel to the first resistive element 201.

In the modulator shown in FIG. 6, the above-described connections of the capacitive elements 300 and 303 cause a zero-point or zero-points to be formed in a transfer function. The zero-point(s) serves to improve the phase margin. Accordingly, a phase shift in a high-frequency region of the delta sigma modulator is reduced by setting a capacitance value Csum1 of the capacitive element 300 and a capacitance value Csum2 of the capacitive element 303 to suitable capacitance values as described in the first and second embodiments, for example. In this manner, the phase margin is ensured and the delta sigma modulator can satisfy the stability condition.

Variations of Third Embodiment

Figure 7:
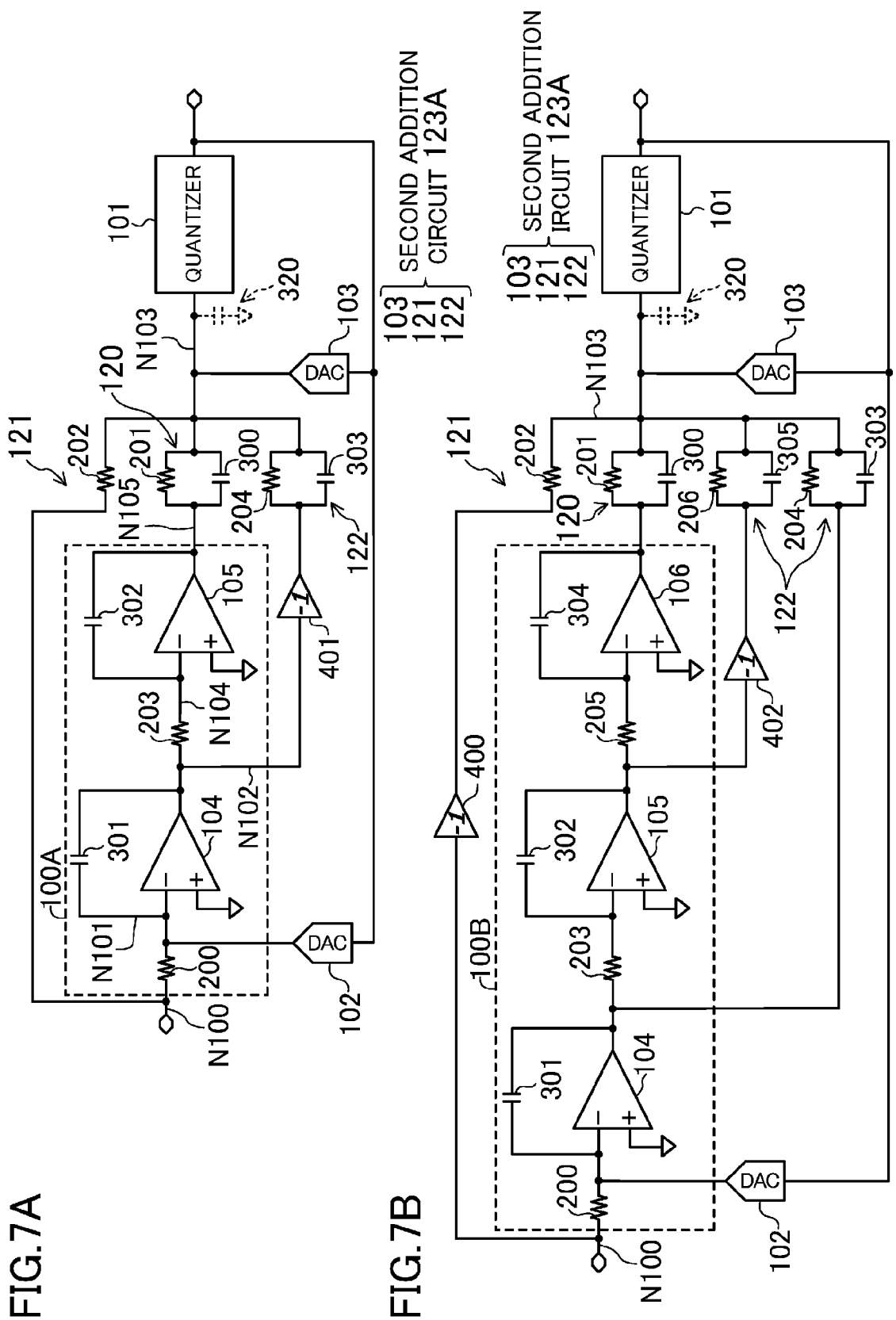
FIGS. 7A and 7B show configuration examples of variations of the delta sigma modulator according to the third embodiment.

Each of FIGS. 7A and 7B shows a configuration example of a variation of the third embodiment.

The delta sigma modulator shown in FIG. 7A includes, in addition to the components of the modulator shown in FIG. 6, a third resistive element 204 which is connected in parallel to a capacitive element 303 of a second feedforward circuit 122. In a manner similar to the modulator shown in FIG. 6, according to the configuration shown in FIG. 7A, a phase shift in a high-frequency region of the delta sigma modulator is reduced by setting the capacitance value Csum1 of the capacitive element 300 and the capacitance value Csum2 of the capacitive element 303 to suitable capacitance values. In this manner, the phase margin is ensured and the delta sigma modulator can satisfy the stability condition.

FIG. 7B shows an example of a third-order delta sigma modulator including three integrators connected in cascade. The delta sigma modulator shown in FIG. 7B differs from the modulator shown in FIG. 7A in that the modulator of FIG. 7B includes a filter circuit 100B which includes, in addition to the components included in the filter circuit shown in FIG. 7A, another integrator including an operational amplifier 106, a resistive element 205, and a capacitive element 304. Further, an inverter element 402, a resistive element 206, and a capacitive element 305 (having a capacitance value Csum3) are added to a second feedforward circuit 122 of the modulator shown in FIG. 7B. The elements 402, 206, and 305 are provided between an output section of an operational amplifier 105 and a node N103, and the elements 206 and 305 are connected in parallel. An inverter element 400 is added to the modulator of FIG. 7B whereas the inverter element 401 included in the modulator of FIG. 7A is omitted from the modulator of FIG. 7B.

In a manner similar to the modulator shown in FIG. 6, according to the configuration shown in FIG. 7B, a phase shift in a high-frequency region of the delta sigma modulator is reduced by setting the capacitance value Csum1 of a capacitive element 300, the capacitance value Csum2 of the capacitive element 303, and the capacitance value Csum3 of the capacitive element 305 to suitable capacitance values. In this manner, the phase margin is ensured and the delta sigma modulator can satisfy the stability condition.

As described above, the delta sigma modulator of this embodiment can compensate a decrease in the phase margin caused by influence of, e.g., the parasitic capacitance 320 of the node N103, the first and second addition circuits 120 and 123A, and the finite gain bandwidth of the operational amplifiers 104, 105 and 106 of the filter circuits 100A and 100B, without increasing the finite gain bandwidth of the operational amplifiers 104, 105 and 106. That is, the delta sigma modulator can satisfy the stability condition without increasing the finite gain bandwidth of the operational amplifiers 104, 105, and 106. According to this embodiment, it is thus possible to produce a highly stable delta sigma modulator whose power consumption and chip area are reduced.

Each of the delta sigma modulators shown in FIGS. 7A and 7B may include, as the second addition circuit 123A, at least one of the first feedforward circuit 121, the digital-to-analog converter 103 (i.e. the first feedback circuit), or the second feedforward circuit 122.

The modulators of the first, second, and third embodiments are similarly advantageous when the modulators are configured as differential circuits. The delta sigma modulator of FIG. 6 which is applied as a differential circuit is described below as a fourth embodiment.

Fourth Embodiment

Figure 8:
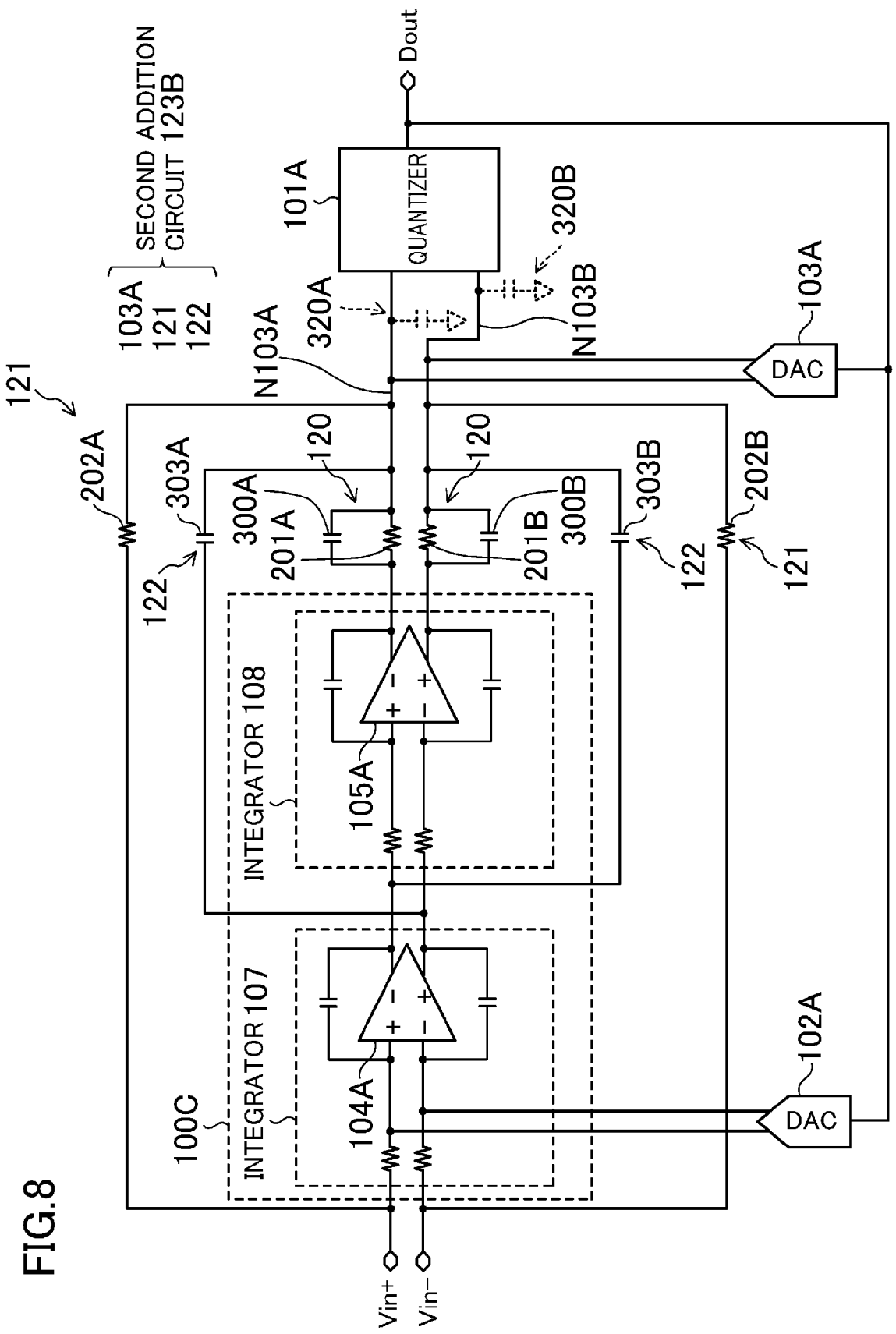
FIG. 8 shows a configuration example of a delta sigma modulator according to a fourth embodiment.

FIG. 8 shows a configuration example of a delta sigma modulator according to the fourth embodiment.

The delta sigma modulator shown in FIG. 8 includes differential input terminals Vin+ and Vin−, a filter circuit 100C, a quantizer 101A, a first digital-to-analog converter 102A, a digital-to-analog converter 103A (i.e., a first feedback circuit), first resistive elements 201A and 201B, second resistive elements 202A and 202B, and capacitive elements 300A, 300B, 303A, 303B (having capacitance values Csum1A, Csum1B, Csum2A, and Csum2B, respectively). Capacitances 320A and 320B represent parasitic capacitances of input nodes N103A and N103B of the quantizer 101A, respectively. A delta sigma modulator configured as a differential circuit does not need to include an inverter element such as the inverter element 400 shown in FIG. 1 or the inverter element 401 shown in FIGS. 4 and 6. Therefore, the modulator shown in FIG. 8 includes no inverter elements.

The filter circuit 100C includes an integrator 107 having an operational amplifier 104A, and an integrator 108 having an operational amplifier 105A.

Analog input signals having been input from the differential terminals Vin+ and Vin− are input to quantizer 101A via the filter circuit 100C and a first addition circuit 120 in which the first resistive element 201A and the capacitive element 300A are connected in parallel and the first resistive element 201B and the capacitive element 300B are connected in parallel. The quantizer 101A quantizes the analog signals and outputs the signals as a digital output signal through an output terminal Dout. The first digital-to-analog converter 102A converts the digital output signal into analog signals and feed back the analog signals to the filter circuit 100C, and the digital-to-analog converter 103A converts the digital output signal into analog signals and feed back the analog signals to input sections of the quantizer 101A. On the other hand, the analog input signals are added to the input sections of the quantizer 101A by a first feedforward circuit 121 including the second resistive elements 202A and 202B. Output signals from the integrator 107 are added to the input sections of the quantizer 101A by a second feedforward circuit 122 including the capacitive elements 303A and 303B.

A phase shift in a high-frequency region of the delta sigma modulator is reduced by setting the capacitance values Csum1A and Csum1B of the capacitive elements 300A and 300B and the capacitance values Csum2A and Csum2B of the capacitive elements 303A and 303B to suitable capacitance values which allow the delta sigma modulator to satisfy the stability condition, with taking into consideration influences of, e.g., the finite gain bandwidth of the operational amplifiers 104A and 105A, the first and second addition circuits 120 and 123B, and the parasitic capacitances 320A and 320B of the nodes N103A and N103B. In this manner, the phase margin is ensured and the delta sigma modulator can satisfy the stability condition.

As described above, use of the circuit configuration of this embodiment enables the delta sigma modulator configured as a differential circuit to satisfy the stability condition without increasing the finite gain bandwidth of the operational amplifiers 104A and 105A. According to this embodiment, it is thus possible to produce a highly stable delta sigma modulator whose power consumption and chip area are reduced.

Fifth Embodiment

Figure 9:
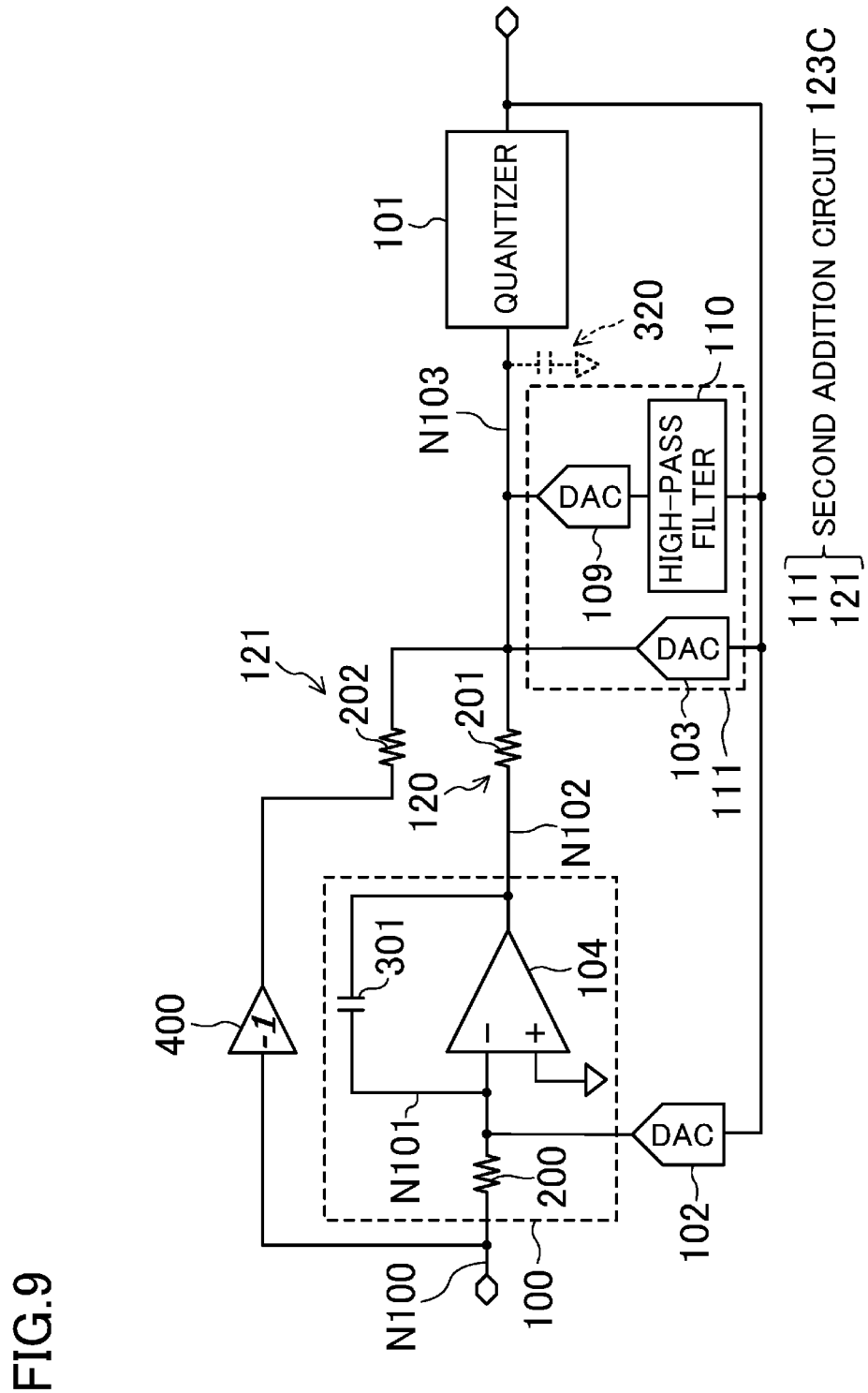
FIG. 9 shows a configuration example of a delta sigma modulator according to a fifth embodiment.

FIG. 9 shows a configuration example of a delta sigma modulator according to a fifth embodiment.

The delta sigma modulator shown in FIG. 9 differs from the modulator shown in FIG. 1 in that: in the modulator of FIG. 9, a first feedback circuit 111 with a digital-to-analog converter 103 includes, in addition to the components shown in FIG. 1, a second digital-to-analog converter 109 and a high-pass filter 110 serving as a phase compensator; and a first addition circuit 120 of FIG. 9 does not include the capacitive element 300. Specifically, in the modulator of FIG. 9, a second addition circuit 123C includes the first feedback circuit 111 and a first feedforward circuit 121, and the first feedback circuit 111 includes the high-pass filter 110 as the phase compensator.

An analog input signal having been input from an input terminal N100 is input to the quantizer 101 via a filter circuit 100 including an integrator having an operational amplifier 104, and a first resistive element 201 (i.e. the first addition circuit 120). The quantizer 101 quantizes the analog signal and outputs the signal as a digital output signal. In a manner similar to the modulator shown in FIG. 1, a first digital-to-analog converter 102 and the digital-to-analog converter 103 convert the digital output signal having been quantized by the quantizer 101 into an analog signal and feed back the analog signal. Further, by means of the high-pass filter 110 and the second digital-to-analog converter 109, part being included in the digital output signal from the quantizer 101 and corresponding to a high frequency component of the yet-to-be quantized analog signal is selectively subjected to digital-to-analog conversion and fed back as an analog signal to the input section of the quantizer 101.

In this manner, the part that is included in the digital output signal having been quantized by the quantizer 101 and corresponds to the high frequency component of the yet-to-be quantized analog signal can be selectively added to the input section of the quantizer 101. Consequently, it is possible to compensate a decrease in the phase margin caused by influences of e.g., a parasitic capacitance 320 of the input node N103 of the quantizer 101, the first and second addition circuits 120 and 123C, and the finite gain bandwidth of the operational amplifier 104. In addition, use of the digital high-pass filter 110 is advantageous to reduce the circuit area (the circuit costs).

The delta sigma modulator of this embodiment can also be configured as a differential circuit, and such a differential circuit also offers the advantages as described above.

The modulator of this embodiment does not always need to include the first feedforward circuit 121 having the second resistive element 202, and the digital-to-analog converter 103. The modulator which does not include the first feedforward circuit 121 and the digital-to-analog converter 103 also offers the advantages as described above.

Examples of Application

Figure 10:
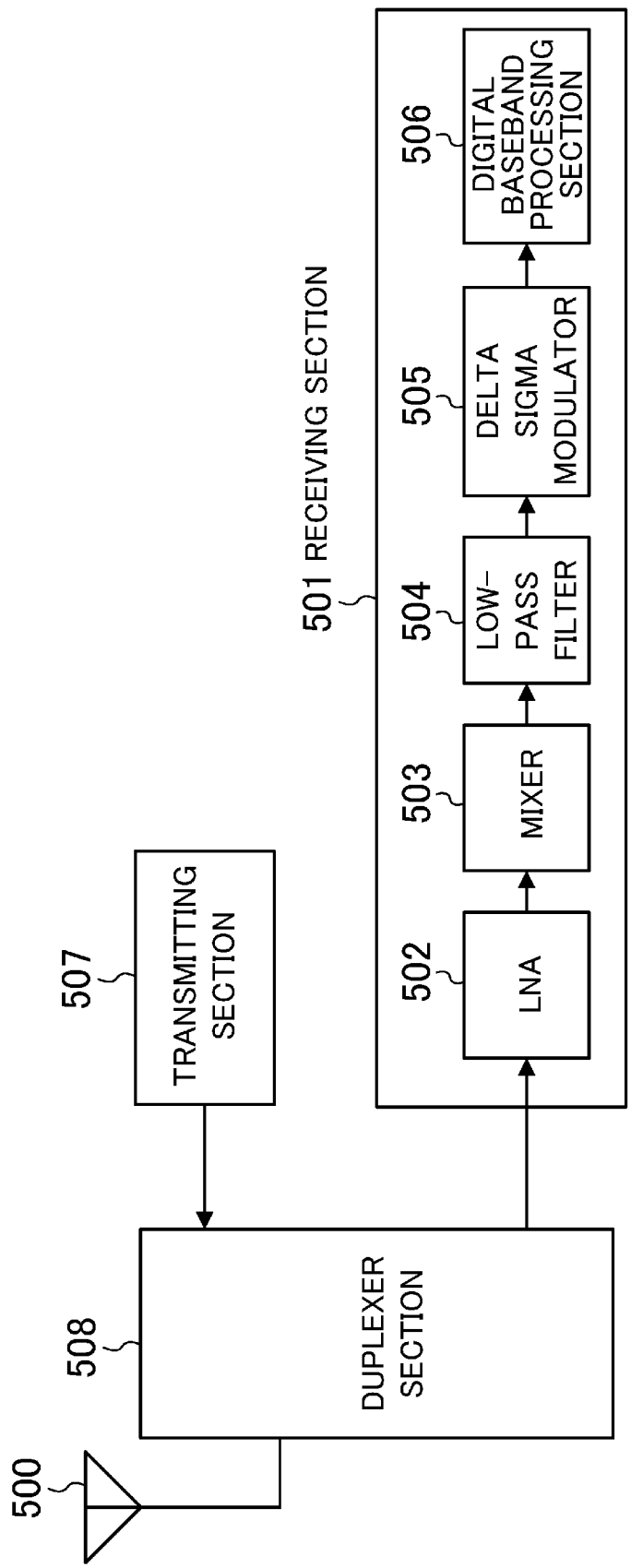
FIG. 10 is a diagram showing a configuration of a wireless communication device which is an application example.
Figure 11:
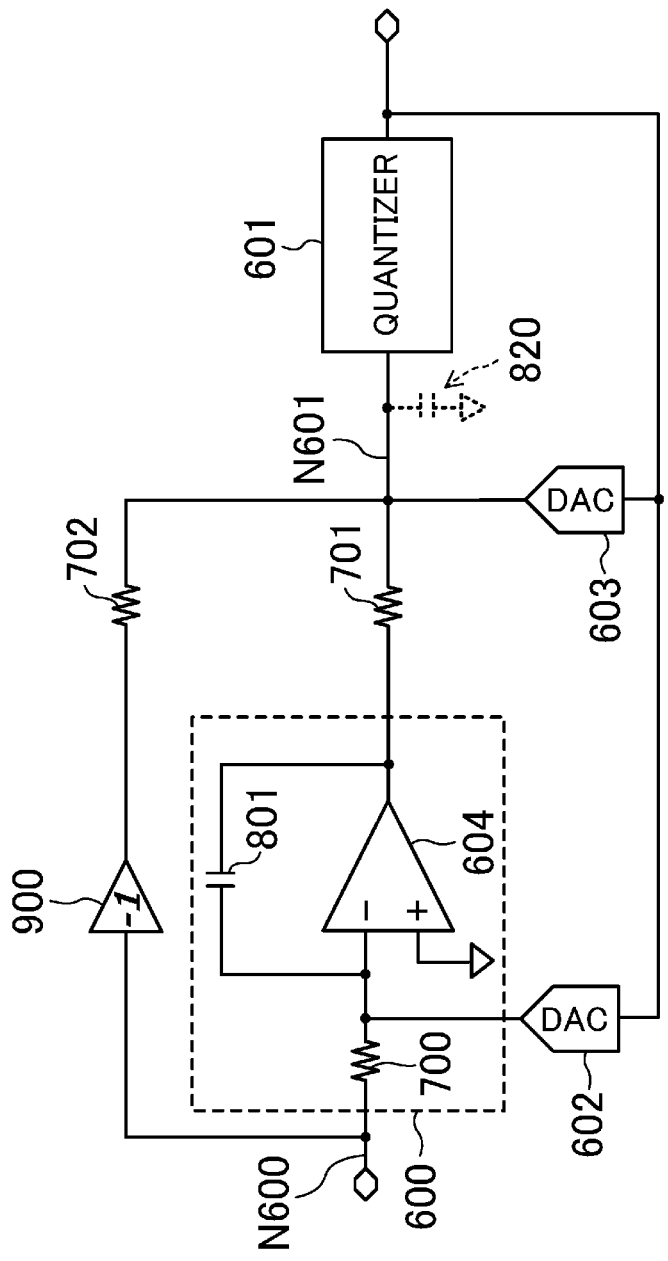
FIG. 11 shows a configuration example of a first-order delta sigma modulator.

FIG. 10 is a diagram showing a configuration of a wireless communication device 50.

The wireless communication device 50 shown in FIG. 10 includes an antenna 500, a duplexer section 508, a transmitting section 507, and a receiving section 501.

The receiving section 501 includes a low noise amplifier (LNA) 502, a mixer 503, a low-pass filter 504, the delta sigma modulator 505 according to any one of the first to fifth embodiments, and a digital baseband processing section 506.

With this configuration, the wireless communication device 50 which maintains accuracy with respect to wide-band signals can be produced. Therefore, application of the device 50 to, e.g., a cellular phone can provide high quality communication while reducing the power consumption and the circuit area of the device.

The delta sigma modulator according to any one of the first to fifth embodiments can also be used in a receiver device. Such a receiver device includes the components shown in FIG. 10 except the duplexer section 508 and the transmitting section 507, for example. In other words, the receiver device in this case includes the antenna 500 and the receiving section 501, and a signal having been input from the antenna 500 is input to the LNA 502 of the receiving section 501.

With this configuration, the receiver device which maintains accuracy with respect to wide-band signals can be produced. Therefore, application of the receiver device to, e.g., a digital TV tuner or a radio tuner can provide transmission and reception of high quality sounds or images while reducing the power consumption and the circuit area of the receiver device.

In the above embodiments, the stability condition is that the modulator has a phase margin of 45 degrees or more. It should be noted that the phase margin required to satisfy the stability condition may vary depending on the environment in which the modulator is used. The capacitance values Csum1, Csum2, and Csum3 may be varied within a range corresponding to the required phase margin (i.e., satisfying the stability condition).

The circuits of the embodiments can be replaced with or combined with each other. For example, the feedback circuit 111 shown in FIG. 9 may be applied to the modulators shown in FIG. 4, 6 or 7.

The delta sigma modulator of the present disclosure requires a small area and consumes a small amount of power while ensuring the stability. Accordingly, the delta sigma modulator of the present disclosure is useful as a data conversion circuit for, e.g., communication devices such as cellular phones and wireless LANs, audio equipment, and video equipment. The wireless communication device and the receiver device of the present disclosure are useful for communication equipment such as cellular phones and wireless LANs as well as for audio equipment and video equipment such as digital TV tuners and radio tuners.

What is claimed is:

1. A delta sigma modulator, comprising:
a filter circuit including at least one integrator having an operational amplifier;
a quantizer which quantizes an output signal from the filter circuit;
a first digital-to-analog converter which converts a digital output signal from the quantizer into a first analog signal and feed back the first analog signal to the filter circuit;
a first addition circuit coupled between an output of the filter circuit and an input of the quantizer, the first addition circuit receiving the output signal from the filter circuit as an input signal, the first addition circuit including at least one passive element, the at least one passive element including a first resistive element; and
a second addition circuit including at least one of a first feedforward circuit connecting an input of the filter circuit to the input of the quantizer via a second resistive element, or a first feedback circuit which feeds back the digital output signal from the quantizer, as a second analog signal, to the input of the quantizer,
wherein the first addition circuit includes a capacitive element serving as the phase compensator and connected in parallel to the first resistive element.

2. The delta sigma modulator of claim 1, wherein
the first feedback circuit includes:
a second digital-to-analog converter which converts the digital output signal from the quantizer into the second analog signal and output the second analog signal to the input of the quantizer, and
a high-pass filter serving as the phase compensator and located between an output of the quantizer and an input of the second digital-to-analog converter.

3. A receiver device, comprising:
an antenna; and
the delta sigma modulator of claim 1, which processes a received signal from the antenna.

4. A wireless communication device, comprising:
an antenna;
the delta sigma modulator of claim 1, which processes a received signal from the antenna;
a transmitter which modulates a transmission signal; and
a duplexer located between the delta sigma modulator and the antenna and between the transmitter and the antenna, the duplexer performs switching between supply of the received signal from the antenna to the delta sigma modulator and supply of the transmission signal from the transmitter to the antenna.

5. The delta sigma modulator of claim 1, wherein the first resistive element is connected between the output of the filter circuit and the input of the quantizer.

6. A delta sigma modulator, comprising:
a filter circuit including integrators connected in cascade and in a plurality of stages, the integrators each including an operational amplifier;
a quantizer which quantizes an output signal from the filter circuit;

a first digital-to-analog converter which converts a digital output signal from the quantizer into a first analog signal and feed back the first analog signal to the filter circuit;

a first addition circuit coupled between an output of the filter circuit and an input of the quantizer, the first addition circuit receiving the output signal from the filter circuit as an input signal, the first addition circuit including at least one passive element, the at least one passive element including a first resistive element; and a second addition circuit including at least one of a first feedforward circuit connecting an input section of the filter circuit to the input of the quantizer via a second resistive element, a first feedback circuit which feeds back the digital output signal from the quantizer, as a second analog signal, to the input section of the quantizer, or a second feedforward circuit which feeds forward an output signal from at least one of the integrators via at least one passive element, wherein the first addition circuit includes a capacitive element serving as the phase compensator and connected in parallel to the first resistive element.

7. The delta sigma modulator of claim 6, wherein the second addition circuit includes the second feedforward circuit, and at least one of the first addition circuit or the second feedforward circuit includes at least one capacitive element serving as the phase compensator and connected to the input of the quantizer.

8. The delta sigma modulator of claim 6, wherein the second addition circuit includes the first and second feedforward circuits, and the at least one passive element included in the second feedforward circuit includes a capacitive element serving as the phase compensator.

9. The delta sigma modulator of claim 6, wherein the second addition circuit includes the second feedforward circuit, and the second feedforward circuit includes the at least one passive element including a third resistive element, and a capacitive element serving as the phase compensator and connected in parallel to the third resistive element.

10. The delta sigma modulator of claim 6, wherein the first feedback circuit includes:

a second digital-to-analog converter which converts the digital output signal from the quantizer into the second analog signal and output the second analog signal to the input of the quantizer, and a high-pass filter serving as the phase compensator and located between an output of the quantizer and an input of the second digital-to-analog converter.

11. A receiver device, comprising:

an antenna; and the delta sigma modulator of claim 6, which processes a received signal from the antenna.

12. A wireless communication device, comprising:

an antenna;

the delta sigma modulator of claim 6, which processes a received signal from the antenna;

a transmitter which modulates a transmission signal; and a duplexer between the delta sigma modulator and the antenna and between the transmitter and the antenna, the duplexer performs switching between supply of the received signal from the antenna to the delta sigma modulator and supply of the transmission signal from the transmitter to the antenna.

13. The delta sigma modulator of claim 6, wherein the first resistive element is connected between the output of the filter circuit and the input of the quantizer.

14. A delta sigma modulator, comprising:

a filter circuit including at least one integrator having an operational amplifier;

a quantizer which quantizes an output signal from the filter circuit;

a first digital-to-analog converter which converts a digital output signal from the quantizer into an analog signal and feed back the analog signal to the filter circuit;

a first resistive element coupled between an output of the filter circuit and an input of the quantizer;

a first feedforward circuit connecting an input section of the filter circuit to the input of the quantizer via a second resistive element; and a capacitive element connected in parallel to the first resistive element, the first resistive element and the capacitive element receiving the output signal from the filter circuit as an input signal.

15. A receiver device, comprising:

an antenna; and the delta sigma modulator of claim 14, which processes a received signal from the antenna.

16. A wireless communication device, comprising:

an antenna;

the delta sigma modulator of claim 14, which processes a received signal from the antenna;

a transmitter which modulates a transmission signal; and a duplexer between the delta sigma modulator and the antenna and between the and the antenna, the duplexer performs switching between supply of the received signal from the antenna to the delta sigma modulator and supply of the transmission signal from the transmitter to the antenna.

* * * * *